(12) United States Patent
Shon et al.

(10) Patent No.: US 10,190,214 B2
(45) Date of Patent: Jan. 29, 2019

(54) DEPOSITION APPARATUS AND DEPOSITION SYSTEM HAVING THE SAME

(71) Applicant: ASM IP Holding B.V., Almere (NL)

(72) Inventors: Jong Won Shon, Seoul (KR); Dae Youn Kim, Daejeon (KR); Sang Don Lee, Yongin-si (KR); Hyun Soo Jang, Daejeon (KR)

(73) Assignee: ASM IP Holding B.V., Almere (NL)

( * ) Notice: Subject to any disclaimer, the term of this patent is extended or adjusted under 35 U.S.C. 154(b) by 296 days.

(21) Appl. No.: 15/208,114

(22) Filed: Jul. 12, 2016

(65) Prior Publication Data

US 2017/0044665 A1 Feb. 16, 2017

(30) Foreign Application Priority Data

Aug. 13, 2015 (KR) .................. 10-2015-0114563

(51) Int. Cl.
*C23C 16/44* (2006.01)
*C23C 16/455* (2006.01)
*C23C 16/509* (2006.01)
*H01J 37/32* (2006.01)

(52) U.S. Cl.
CPC ...... *C23C 16/4412* (2013.01); *C23C 16/4401* (2013.01); *C23C 16/45544* (2013.01); *C23C 16/5096* (2013.01); *H01J 37/3244* (2013.01); *H01J 37/32458* (2013.01); *H01J 37/32568* (2013.01); *H01J 37/32715* (2013.01); *H01J 37/32834* (2013.01)

(58) Field of Classification Search
CPC .................................................. C23C 16/4412
See application file for complete search history.

(56) References Cited

U.S. PATENT DOCUMENTS

| 6,486,081 | B1 | 11/2002 | Ishikawa et al. |
| 9,039,837 | B2 | 5/2015 | Honma |
| 2004/0231799 | A1* | 11/2004 | Lee ..................... C23C 16/4412 156/345.34 |
| 2006/0137608 | A1 | 6/2006 | Choi et al. |
| 2015/0007774 | A1 | 1/2015 | Iwasaki et al. |

FOREIGN PATENT DOCUMENTS

| CN | 104115261 | 10/2014 |
| TW | 201317383 | 5/2013 |
| WO | 2013/122043 | 8/2013 |

\* cited by examiner

*Primary Examiner* — Joseph A Miller, Jr.
(74) *Attorney, Agent, or Firm* — Sand & Sebolt (57) ABSTRACT

A deposition apparatus includes: a substrate support having a main surface on which a substrate is placed; a body disposed on the main surface and including a hollow portion having an exposed upper portion; a plasma electrode unit provided at a inner circumferential surface of the body to separate the hollow portion into an upper space and a lower space; and a gas supply unit supplying process gas to the plasma electrode unit, wherein a gas exhaust channel extending from the lower space to an exhaust outlet provided at a top of the body is formed in the body.

27 Claims, 9 Drawing Sheets

DEPOSITION APPARATUS AND DEPOSITION SYSTEM HAVING THE SAME

CROSS-REFERENCE TO RELATED APPLICATION

This application claims the benefit of Korean Patent Application No. 10-2015-0114563, filed on Aug. 13, 2015, in the Korean Intellectual Property Office, the disclosure of which is incorporated herein in its entirety by reference.

BACKGROUND

1. Field

One or more embodiments relate to a deposition apparatus, and more particularly, to a deposition apparatus having an upward exhaust structure for discharging exhaust gas in an upward direction of the deposition apparatus.

2. Description of the Related Art

Many efforts have been made to improve apparatuses and systems for forming high-quality thin films on substrates in a semiconductor device manufacturing process. According to a recently proposed atomic layer deposition (ALD) method, two or more reactants are sequentially supplied to a substrate at different times to form a thin film on the substrate by surface reactions, and this process is repeated to grow the thin film to an intended thickness.

Along with the decrease in the line widths of circuits of semiconductor devices, deposition process conditions have also been tightened, and research has been conducted to reduce or prevent contamination of the outside and inside of a reactor and thus to improve the quality of semiconductor devices.

SUMMARY

One or more embodiments include a deposition apparatus configured to reduce or prevent contamination in the inside and outside of the deposition apparatus during a process, and a deposition system including the deposition apparatus.

One or more embodiments include a deposition apparatus configured to prevent leakage of plasma power applied to electrodes during a plasma process, and a deposition system including the deposition apparatus.

Additional aspects will be set forth in part in the description which follows and, in part, will be apparent from the description, or may be learned by practice of the presented embodiments.

According to one or more embodiments, a deposition apparatus includes: a substrate support having a main surface on which a substrate is placed; a body disposed on the main surface and including a hollow portion having an exposed upper portion; a plasma electrode unit provided at a inner circumferential surface of the body and defining an upper space and a lower space of the hollow portion; and a gas supply unit supplying process gas to the plasma electrode unit, wherein a gas exhaust channel extending from the lower space to an exhaust outlet provided at a top of the body is formed in the body.

At least one groove connecting an outer region of the body and the gas exhaust channel may be formed in a bottom surface of the body.

The substrate support may include a protruding portion that protrudes in a direction perpendicular to the main surface and extends along an edge of the main surface while being spaced apart from the edge of the main surface.

The substrate support may include a recess portion connected to the protruding portion at a side towards a center of the substrate support and extending along the protruding portion.

The body may include a support stepped portion protruding inward along the inner circumferential surface of the body, and the deposition apparatus may further include a support member disposed between the support stepped portion and the plasma electrode unit, the support member supporting the plasma electrode unit such that the plasma electrode unit may be spaced apart from the body.

The gas supply unit may include a flange portion in a region connected to the plasma electrode unit, wherein the flange portion and the support member may include an insulating material.

The plasma electrode unit may include a showerhead electrode and a back plate disposed between the showerhead electrode and the flange portion.

The back plate may include an insulating material.

The back plate may include a gas supply channel connected to a plurality of nozzles formed at the showerhead electrode.

The deposition apparatus may further include a sealing member disposed between the support member and the support stepped portion, between the support member and the showerhead electrode, between the showerhead electrode and the back plate, and between the back plate and the flange portion.

The showerhead electrode may be connected to at least one radio frequency (RF) connector.

The body may include a reactor wall and a duct member connected a top of the reactor wall.

A first depressed portion may be formed at the top of the reactor wall and a second depressed portion corresponding to the first depressed portion may be formed at a side of the duct member, wherein the first and second depressed portions may be combined to form an exhaust path forming a part of the gas exhaust channel, and the exhaust path may be connected to the exhaust outlet.

The deposition apparatus may further include a sealing member disposed at a surface formed by a combination of the reactor wall and the duct member.

The gas exhaust channel may include: a first channel connected to the lower space and formed along an outer circumference of the body between the outer circumference and an inner circumference of the body; a second channel connected to the exhaust outlet and formed along the outer circumference of the body between the outer and inner circumferences of the body; and exhaust holes connecting the first and second channels.

The deposition apparatus may further include a cover unit disposed at the top of the body and covering the upper space.

The deposition apparatus may further include a moving unit moving the substrate support in an up-and-down direction.

According to one or more embodiments, a deposition apparatus includes: a substrate support having a main surface on which a substrate is placed; a body having a bottom surface at least partially contacting an edge portion of the main surface of the substrate support and a top surface at least partially externally exposed; and a plasma electrode unit provided at a inner circumferential surface of the body and defining a reaction space between the substrate support and the plasma electrode unit, wherein a gas exhaust channel extending from the reaction space to an exhaust outlet provided at a top of the body is formed in the body, and at least one groove connecting the gas exhaust channel to an outer region is formed at any one of the body and the substrate support in a region where the body and the substrate support contact each other.

The body may include a reactor wall and a duct member connected to a top of the reactor wall.

A first depressed portion may be formed at the top of the reactor wall and a second depressed portion corresponding to the first depressed portion may be formed at a side of the duct member, wherein the first and second depressed portions may be combined to form an exhaust path forming a part of the gas exhaust channel, and the exhaust path may be connected to the exhaust outlet.

The deposition apparatus may further include a sealing member provided at a surface formed from a combination of the reactor wall and the duct member.

The plasma electrode unit may include a showerhead electrode connected to at least one radio frequency (RF) connector.

According to one or more embodiments, a deposition system includes: an outer chamber having an inner space; at least one deposition apparatus in the inner space; a deposition gas source supplying a deposition gas to the at least one deposition apparatus; a reaction gas source supplying a reaction gas to the at least one deposition apparatus; and an exhaust pump connected to the at least one deposition apparatus via an exhaust line.

Pressure in the inner space of the outer chamber may be higher than pressure in the at least one deposition apparatus.

The at least one deposition apparatus may share, with at least one other deposition apparatus, the deposition gas source, the reaction gas source, and the exhaust line connecting the at least one deposition apparatus to the exhaust pump.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Embodiments will now be described with reference to the accompanying drawings. However, the embodiments may have different forms and should not be construed as being limited to the descriptions set forth herein. The embodiments are provided so that this disclosure will be thorough and complete, and will fully convey the scope of the inventive concept to those skilled in the art. In the drawings, like reference numbers refer to like elements throughout. In addition, elements and regions are schematically illustrated in the accompanying drawings. Therefore, the inventive concept is not limited to relative sizes or intervals illustrated in the drawings. As used herein, the term "and/or" includes any and all combinations of one or more of the associated listed items.

It will be understood that although the terms of first and second are used herein to describe various elements, these elements should not be limited by these terms. Terms are only used to distinguish one element from other elements. For example, a first element may be termed a second element, or a second element may be termed a first element without departing from the teachings of the inventive concept.

In the following description, technical terms are used only for explaining specific embodiments, and are not purposes of limitation. As used herein, the singular forms "a," "an" and "the" are intended to include the plural forms as well, unless the context clearly indicates otherwise. The meaning of "include" or "comprise" specifies a property, a fixed number, a step, a process, an element, a component, and a combination thereof but does not exclude other properties, fixed numbers, steps, processes, elements, components, and combinations thereof.

Unless otherwise defined, all terms (including technical and scientific terms) used herein have the same meaning as commonly understood by those of ordinary skill in the art to which the inventive concept belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A deposition apparatus described below may have various structures. However, only some structures of the deposition apparatus are described as examples, and thus the inventive concept is not limited thereto.

Figure 1:
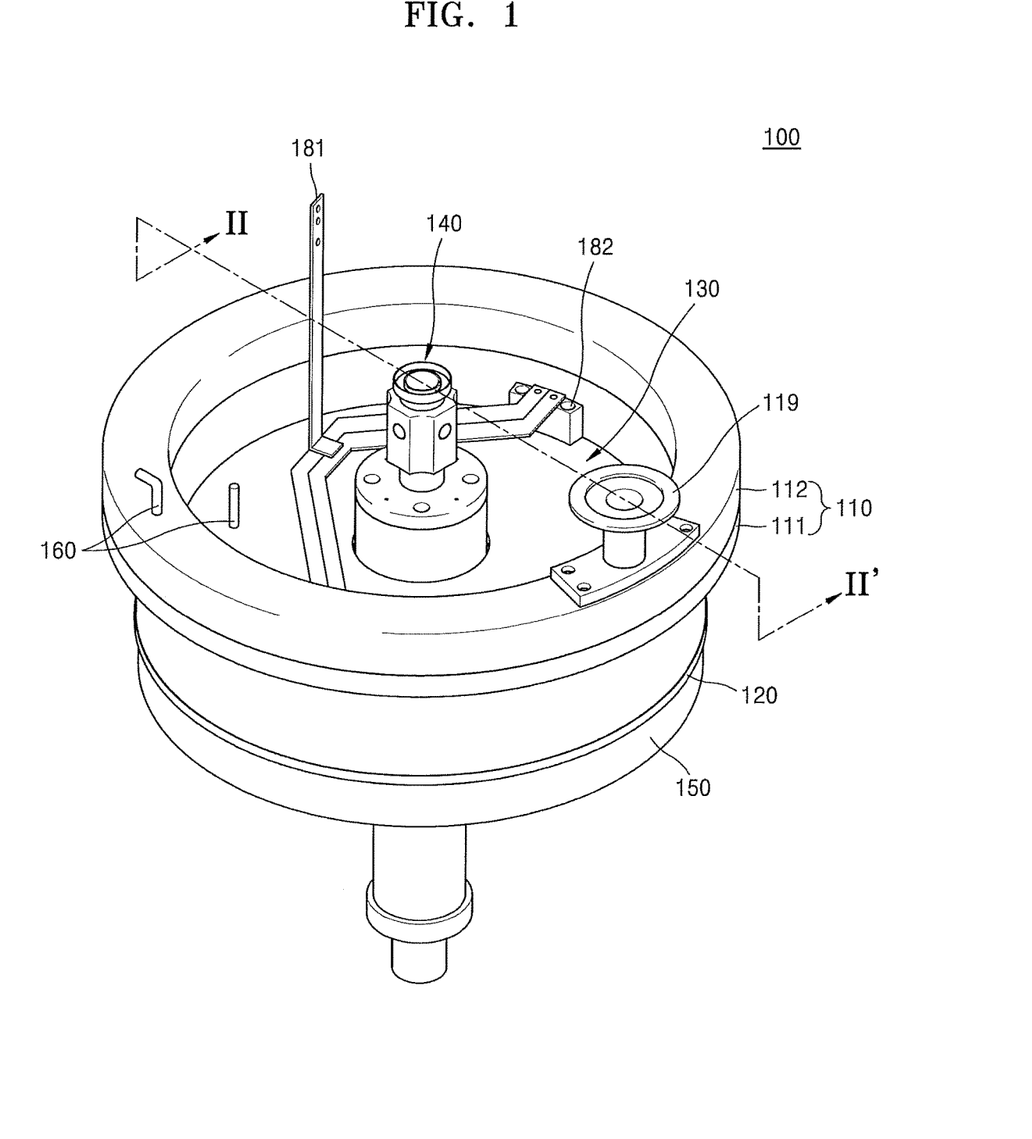
FIG. 1 is a perspective view illustrating a deposition apparatus according to an embodiment.
Figure 2:
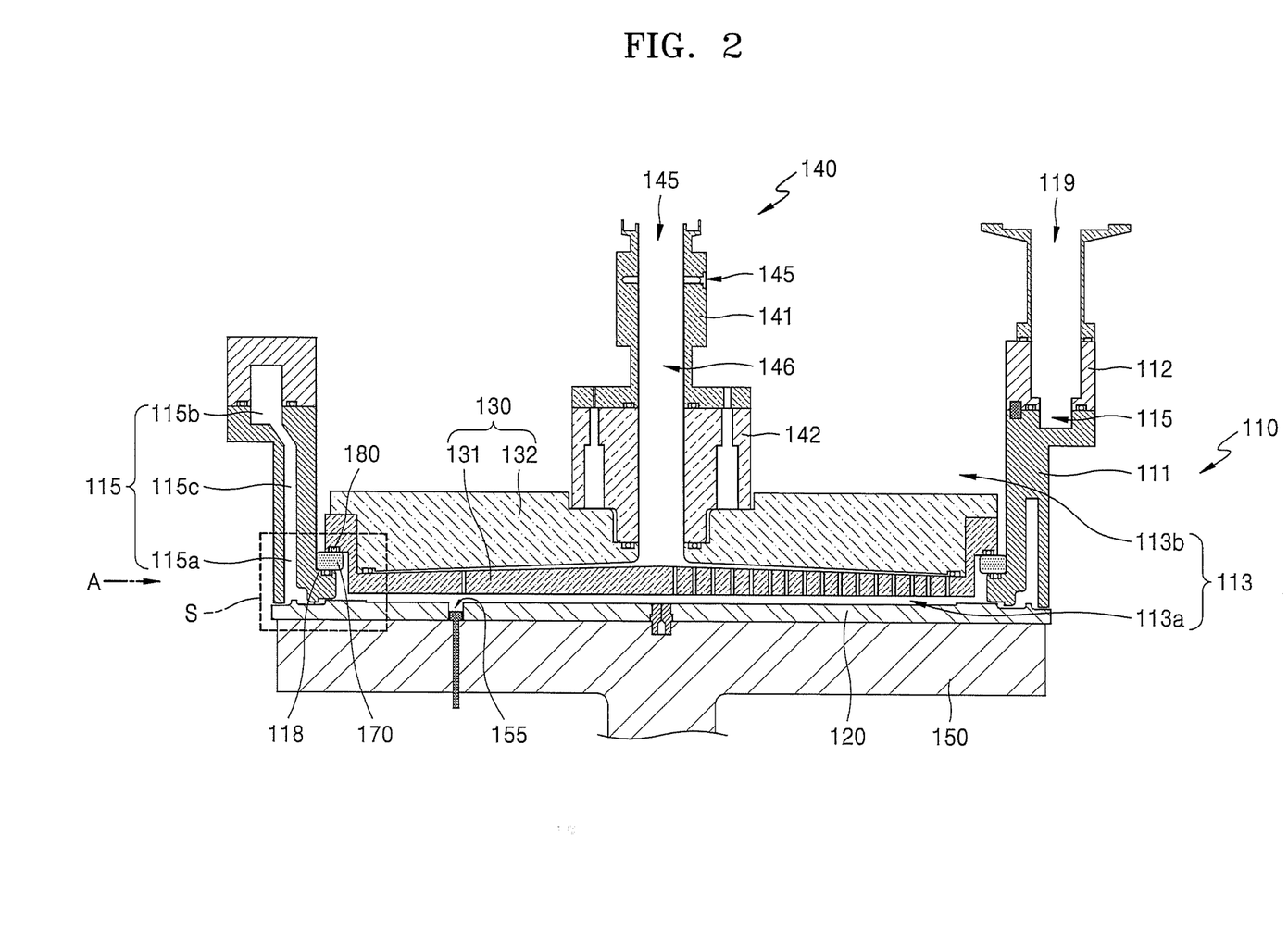
FIG. 2 is a cross-sectional view taken along line II-II' of FIG. 1.

FIG. 1 is a perspective view illustrating a deposition apparatus 100 according to an embodiment. FIG. 2 is a cross-sectional view taken along line II-II' of FIG. 1.

Referring to FIGS. 1 and 2, the deposition apparatus 100 may include a substrate support 120, a body 110 arranged on the substrate support 120, a plasma electrode unit 130 provided at an inner circumferential surface of the body 110, support members 170, and a gas supply unit 140 configured to supply a process gas to the plasma electrode unit 130.

The substrate support 120 may have a main surface to receive and support a substrate thereon. For example, the substrate support 120 may be a susceptor. In some embodiments, the substrate support 120 may be movably configured by connecting the substrate support 120 to a moving unit 150 provided at a side of the substrate support 120. For example, the moving unit 150 may move the substrate support 120 upward or downward to form a substrate entrance between the body 110 and the substrate support 120. For example, when a substrate is loaded on the substrate support 120 or unloaded from the substrate support 120 by using a transfer arm, the moving unit 150 lowers the substrate support 120. However, when a deposition process is performed on a substrate, the moving unit 150 may lift the substrate support 120 to bring the substrate support 120 into contact with the body 110 and form a reaction space between the substrate support 120 and the body 110.

Holes 155 may be formed through the substrate support 120 in a direction perpendicular to the main surface of the substrate support 120, and lift pins may be accommodated in the holes 155. When the moving unit 150 descends to load or unload a substrate, the lift pins accommodated in the holes 155 may support the substrate in a pin-up state with respect to the moving unit 150. In addition, when the moving unit 150 moves upward to perform a process, the lift pins may be in a pin-down state with respect to the moving unit 150, and thus the substrate may be placed on the substrate support 120.

In addition, the substrate support 120 may include a heater to heat a substrate placed on the main surface of the substrate support 120, and the heater may be vertically moved by the moving unit 150.

The body 110 may be placed on the main surface of substrate support 120 and may include a hollow portion 113 having an exposed upper portion.

The body 110 may have openings in top and bottom surfaces thereof, and the hollow portion 113 may extend between the openings. That is, the inside of the body 110 may be exposed to the outside through the openings formed in the top and bottom surfaces of the body 110. A lower side of the hollow portion 113 may be closed by the substrate support 120.

The hollow portion 113 may be divided into an upper space 113b and a lower space 113a by the plasma electrode unit 130 (described later). The upper space 113b may be a space between the plasma electrode unit 130 and the opening of the top surface of the body 110, and the lower space 113a may be a space between the plasma electrode unit 130 and the substrate support 120. The lower space 113a may become a reaction space in which a deposition process is performed on a substrate placed on the substrate support 120.

Herein, the reaction space is a region surrounded by the plasma electrode unit 130, the substrate support 120, and the body 110, and while gas supplied through the plasma electrode unit 130 to the reaction space undergoes a chemical reaction, a thin film may be formed on a substrate placed on the substrate support 120.

A gas exhaust channel 115 may be formed in a wall of the body 110, and the gas exhaust channel 115 may extend from the lower space 113a to an exhaust outlet 119 provided in the top of the body 110. That is, during a deposition process, exhaust gas may be discharged from the lower space 113a to the exhaust outlet 119 through the gas exhaust channel 115. In other words, the deposition apparatus 100 may have an upward exhaust structure. Since exhaust gas generated in the lower space 113a is discharged upward through the gas exhaust channel 115 formed in the body 110, other external devices may not be damaged by the exhaust gas. That is, if exhaust gas is discharged through a lower side of the deposition apparatus 100, other external devices may be damaged by the exhaust gas. For example, referring to FIG. 10, in an outer chamber 1200 in which deposition apparatuses 1100 are arranged, the deposition apparatuses 1100 or other devices may not be damaged by exhaust gas discharged from the deposition apparatuses 1100 owing to an upward exhaust structure.

The plasma electrode unit 130 is placed along the inner circumference of the body 110. The plasma electrode unit 130 may be separated from the substrate support 120 with the lower space 113a being therebetween. Process gas may be injected into the lower space 113a through a plurality of gas nozzles formed through the plasma electrode unit 130, and radio frequency (RF) power may be supplied to the plasma electrode unit 130 to generate plasma in the lower space 113a.

For example, the plasma electrode unit 130 may include a back plate 132 and a showerhead electrode 131 coupled to the back plate 132. A gas supply channel 146 formed in the gas supply unit 140 may be extended to the back plate 132, and a plurality of nozzles may be formed through upper and lower sides of the showerhead electrode 131. Process gas introduced through a gas inlet hole 145 of the gas supply unit 140 may flow to the showerhead electrode 131 through the gas supply channel 146, and then the process gas may be supplied to the lower space 113a through the plurality of nozzles of the showerhead electrode 131.

An RF connector 182 may be connected to an upper side of the showerhead electrode 131. The RF connector 182 may apply RF power to the showerhead electrode 131. In FIG. 1, only one RF connector 182 is illustrated. However, a plurality of RF connectors 182 may be arranged at regular intervals along an edge of the showerhead electrode 131. The plurality of RF connectors 182 may be connected to a power supply through an RF rod 181 branching into a plurality of parts. Since the plurality of RF connectors 182 are symmetrically arranged, the density of plasma generated in the lower space 113a may be uniform, and thus a deposition process may be reliably performed.

In addition, the plasma electrode unit 130 and the body 110 may include a plurality of heating elements 160. The plurality of heating elements 160 may be connected to the body 110 and arranged at regular intervals. In addition, the heating elements 160 may be connected to the plasma electrode unit 130 and arranged at regular intervals. The plasma electrode unit 130 and the body 110 may be heated together by the plurality of heating elements 160, and thus the reaction space may have a uniform heat distribution during a deposition process. As a result, the deposition process may be reliably performed, and the formation of pollutants caused by non-uniform heat distribution may be prevented.

The showerhead electrode 131 may include a metal-containing material. For example, the showerhead electrode 131 may include aluminum (Al). The back plate 132 may include an insulating material such as a ceramic material.

The gas supply unit 140 may include: a gas inlet tube 141 through which the gas inlet hole 145 is formed; and a flange portion 142 between the gas inlet tube 141 and the plasma electrode unit 130. A plurality of gas inlet holes 145 may be formed in the gas inlet tube 141. For example, in a process such as an atomic layer deposition (ALD) process not allowing mixing of process gases, the number of gas inlet holes 145 may be determined according to the number of process gases. However, a single gas inlet hole 145 may be used to supply process gases not reacting with each other unless excited, for example, by plasma.

In some embodiments, the body 110 may include a support stepped portion 118 protruding inward along the inner circumferential surface of the body 110, and the plasma electrode unit 130 may be supported by the support members 170 arranged on the support stepped portion 118. That is, lower sides of the support members 170 may be in contact with the support stepped portion 118 of the body 110, and upper sides of the support members 170 may be in contact with the plasma electrode unit 130.

The support members 170 may extend along the inner circumferential surface of the body 110, and the lower space 113a may be sealed by the support members 170. In addition, the plasma electrode unit 130 may not be in contact with the body 110. That is, the plasma electrode unit 130 may be separated from the body 110 and may be placed on the support members 170.

In some embodiments, so as to prevent plasma power applied to the plasma electrode unit 130 from being discharged to the surrounding of the plasma electrode unit 130 during a plasma process, the support members 170 and the flange portion 142 contacting the plasma electrode unit 130 may include an insulating material. For example, the support members 170 and the flange portion 142 may include an insulating material such as a ceramic material. That is, the support members 170 and the flange portion 142 directly contacting the plasma electrode unit 130 including a metal-containing material may be formed of an insulating material so as to insulate the plasma electrode unit 130, thereby preventing leakage of plasma power and increasing the efficiency of a plasma process. Furthermore, in some embodiments, the back plate 132 contacting the flange portion 142 may include an insulating material so as to effectively prevent leakage of plasma power.

In addition, since the body 110 is exposed to the atmosphere through the opening formed in the top surface thereof, the upper space 113b may be filled with an external gas, and thus the pressure of the upper space 113b may be maintained to be substantially the same as atmospheric pressure. The external gas filled in the upper space 113b adjoining an upper side of the plasma electrode unit 130 may function as an insulator for the plasma electrode unit 130. Therefore, plasma power applied to the plasma electrode unit 130 may not leak to the upper space 113b.

In some embodiments, a sealing member 180 may be used so as to effectively isolate the lower space 113a from the upper space 113b. If the lower space 113a is not isolated from the upper space 113b, reaction gas filled in the lower space 113a may leak to the upper space 113b. In this case, the efficiency of a deposition process may decrease, and thin films having poor quality may be deposited on substrates. Moreover, problems regarding safety may occur. The sealing member 180 may be an O-ring. However, the sealing member 180 is not limited thereto.

For example, a sealing member 180 may be arranged between the support members 170 and the support stepped portion 118 and another sealing member 180 may be arranged between the support members 170 and the plasma electrode unit 130. The sealing member 180 arranged between the support members 170 and the support stepped portion 118 and the sealing member 180 arranged between the support members 170 and the plasma electrode unit 130 may prevent leakage of reaction gas from the lower space 113a to the upper space 113b.

In addition, a sealing member such as an O-ring may be arranged between the showerhead electrode 131 and the back plate 132 so as to prevent leakage of process gas. For example, the sealing member may be arranged between the showerhead electrode 131 and the back plate 132 in a region separated from the outermost nozzles of the plurality of nozzles formed in the showerhead electrode 131 by a given distance in a radial direction of the showerhead electrode 131. Owing to the sealing member arranged between the showerhead electrode 131 and the back plate 132, process gas supplied through the gas supply channel 146 may flow to the plurality of nozzles of the showerhead electrode 131 and may not leak to the upper space 113b through a gap between the showerhead electrode 131 and the back plate 132.

In addition, a sealing member such as an O-ring may be arranged between the back plate 132 and the flange portion 142 so as to prevent leakage of process gas. Owing to the sealing member arranged between the back plate 132 and the flange portion 142, process gas supplied through the gas supply channel 146 may not leak through a gap between the back plate 132 and the flange portion 142.

Figure 3:
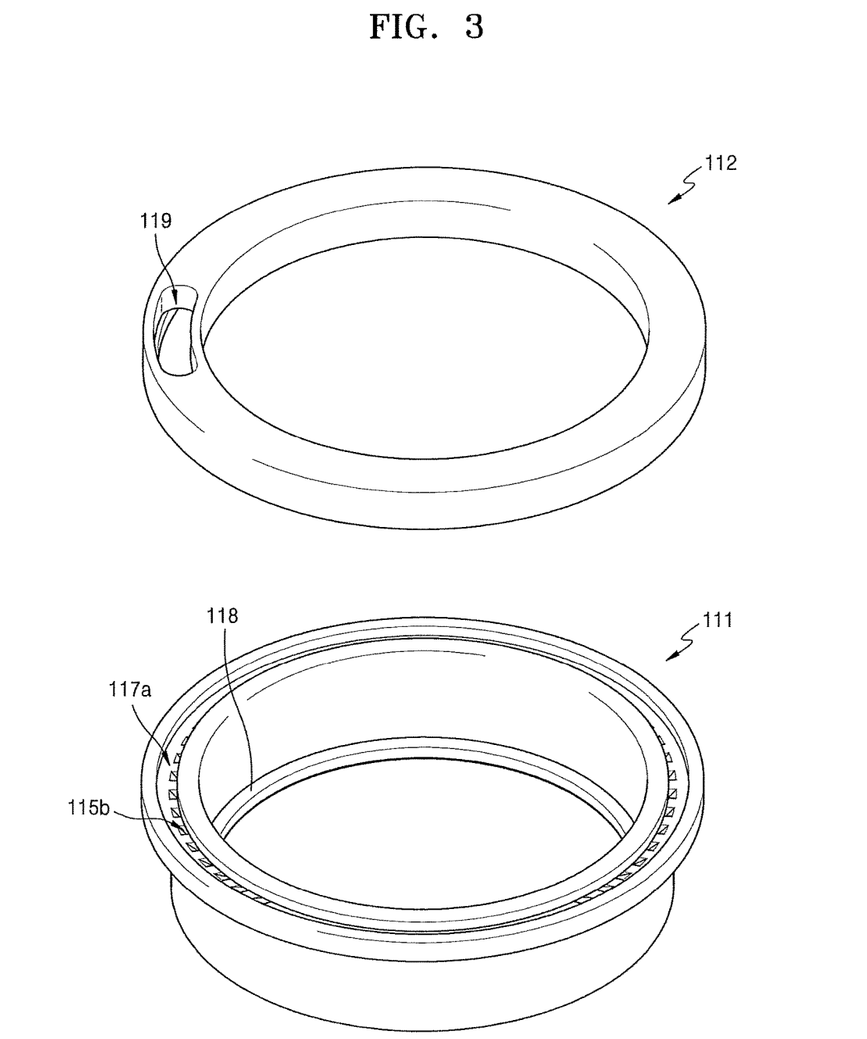
FIG. 3 is a perspective view illustrating a body.
Figure 4:
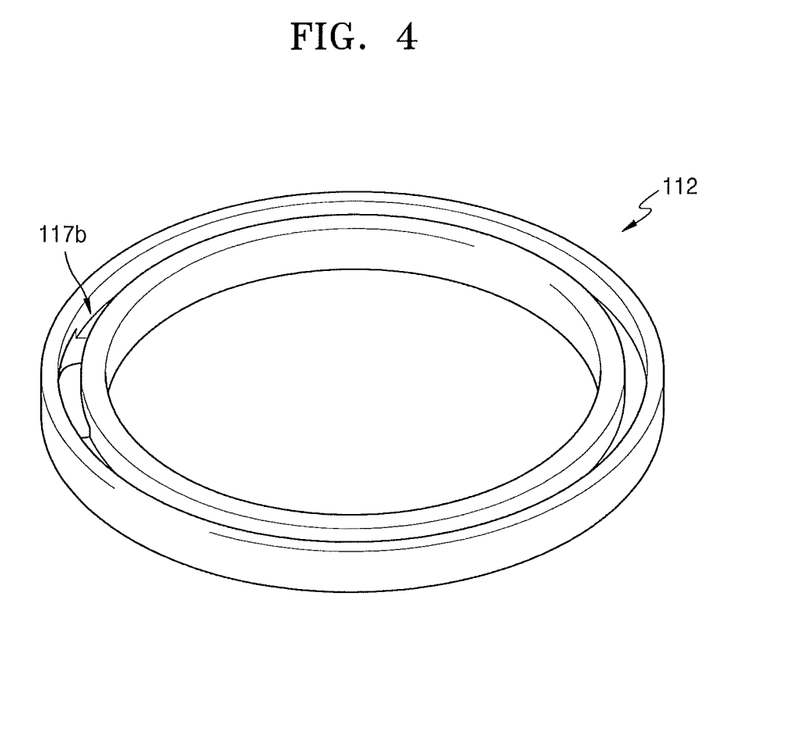
FIG. 4 is a rear perspective view illustrating a duct member depicted in FIG. 3.

FIG. 3 is an exploded perspective view illustrating the body 110, and FIG. 4 is a rear perspective view illustrating a duct member 112 depicted in FIG. 3.

The structure of the body 110 and the gas exhaust channel 115 formed in the body 110 will be described according to the embodiment with reference to FIGS. 3 and 4 together with FIG. 2.

The body 110 may include a reactor wall 111 and the duct member 112, and the duct member 112 may be coupled to the top of the reactor wall 111.

A first channel 115a connected to the lower space 113a may be formed in a lower portion of the reactor wall 111. The first channel 115a may extend along the outer or inner circumferences of the reactor wall 111 in a region between the outer and inner circumferences of the reactor wall 111. For example, the first channel 115a may have a ring shape.

A first depressed portion 117a may be formed at the top of the reactor wall 111 in a region between the outer and inner circumferences of the reactor wall 111. The first depressed portion 117a may extend along the outer or inner circumference of the body 110. A second depressed portion 117b may be formed in a side of the duct member 112 in a region between the outer and inner circumferences of the duct member 112. The second depressed portion 117b may extend along the outer or inner circumference of the duct member 112. The reactor wall 111 and the duct member 112 may be coupled to each other in such a manner that an exposed surface of the first depressed portion 117a and an exposed surface of the second depressed portion 117b may correspond to each other. In this manner, a second channel 115b being a part of the gas exhaust channel 115 may be formed. The second channel 115b may be connected to the outside of the body 110 through the exhaust outlet 119 formed in a side of the duct member 112. For example, the second channel 115b may have a ring shape.

As illustrated in FIG. 2, surfaces between the reactor wall 111 and the duct member 112 may include a sealing member so as to seal the second channel 115b formed by coupling the duct member 112 to the reactor wall 111.

In addition, the first channel 115a and the second channel 115b may be connected to each other through at least one exhaust hole 115c. The exhaust hole 115c may be formed in the reactor wall 111 and may extend in a length direction of the reactor wall 111. If a plurality of exhaust holes 115c is formed, the exhaust holes 115c may be arranged at regular intervals along the outer or inner circumference of the reactor wall 111.

Figure 5:
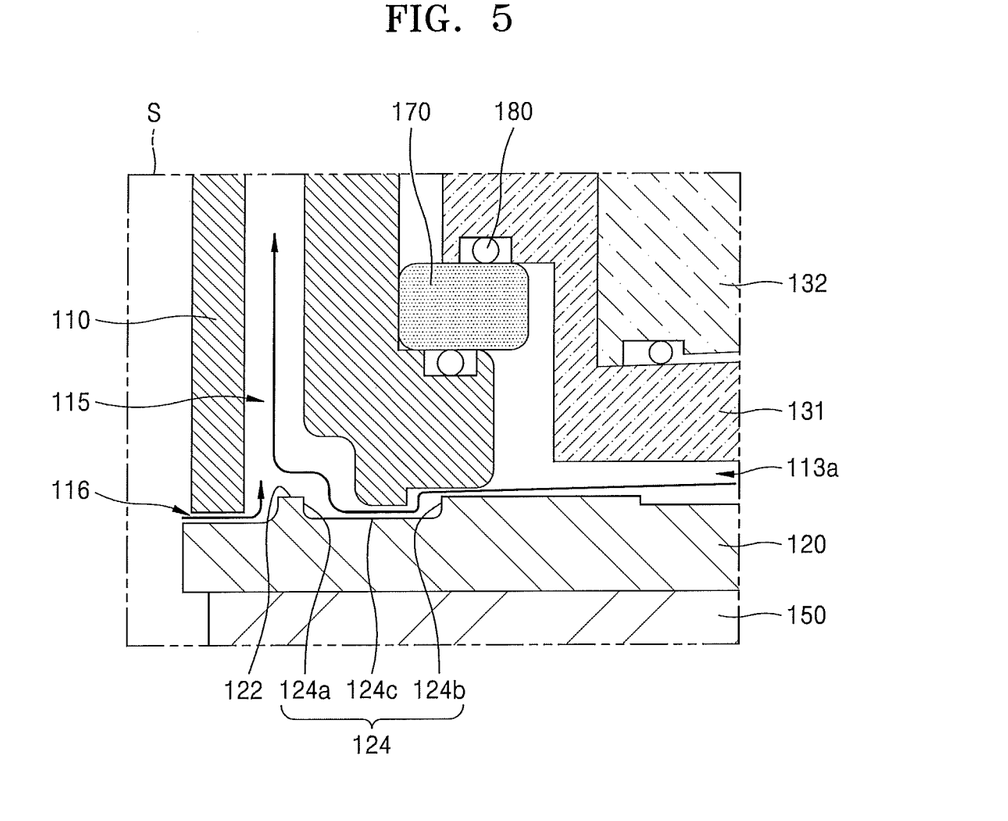
FIG. 5 is an enlarged cross-sectional view illustrating a region S of FIG. 2.
Figure 6:
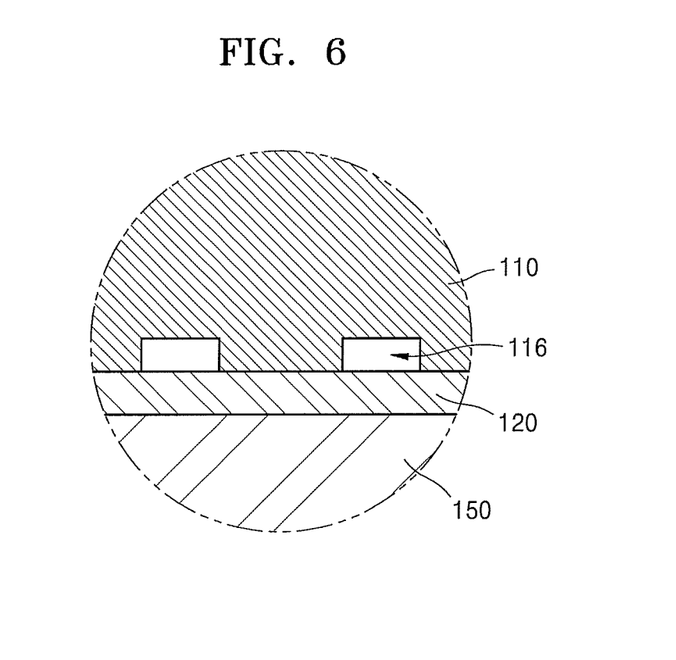
FIG. 6 is an enlarged view taken in a direction A in FIG. 2 to illustrate a contact region between the body and a substrate support.
Figure 7:
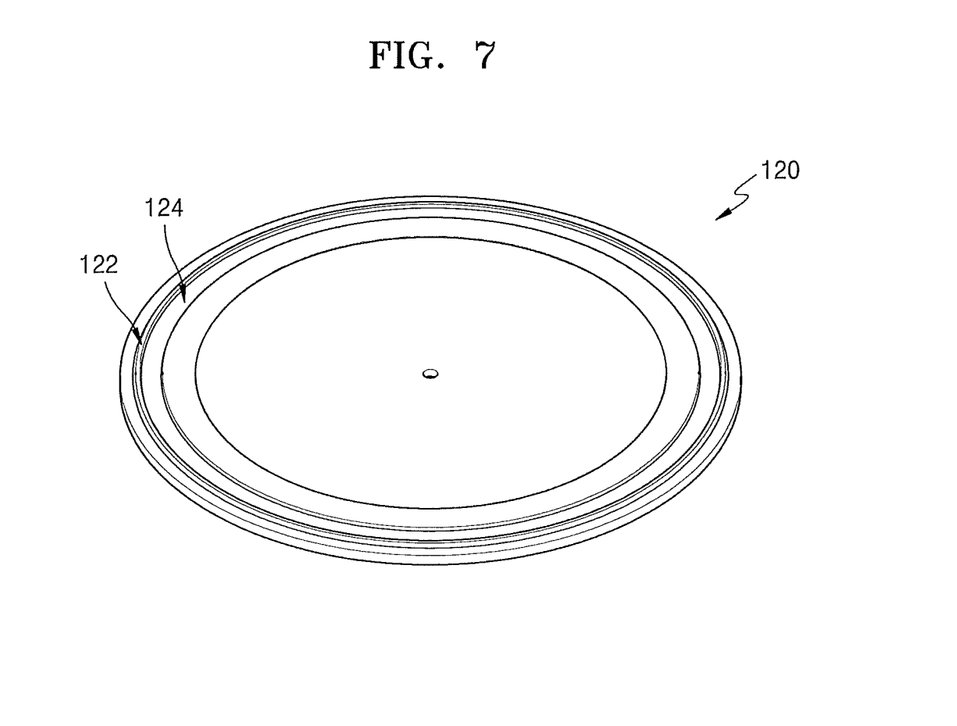
FIG. 7 is a perspective view illustrating the substrate support.

FIG. 5 is an enlarged cross-sectional view illustrating a region S of FIG. 2. FIG. 6 is an enlarged view taken in a direction A in FIG. 2 to illustrate a contact region between the body 110 and the substrate support 120. FIG. 7 is a perspective view illustrating the substrate support 120.

Referring to FIGS. 5 and 6, one or more grooves 116 may be formed in a bottom surface of the body 110 along edges of the bottom surface of the body 110 so as to spatially connect an outer region of the body 110 to the gas exhaust channel 115. For example, the outside of the body 110 may be under an inert gas atmosphere such as an argon (Ar) gas atmosphere, and although the bottom surface of the body 110 is in contact with an top surface of the substrate support 120, inert gas may be introduced from the outside of the body 110 into the gas exhaust channel 115 through the grooves 116.

The grooves 116 may be provided to remove contaminants such as particles accumulated in a contact region between the body 110 and the substrate support 120. Since the contact region between the body 110 and the substrate support 120 in which particle sources are easily accumulated is opened to the outside of the body 110 through the grooves 116, inert gas introduced through the grooves 116 may prevent the accumulation of reaction byproducts and thus the generation of pollutant particles. If the body 110 is continuously in contact with an edge region of the substrate support 120, the body 110 and the substrate support 120 may form a simple face sealing structure. In this case, a small leak may occur. That is, gas may leak or permeate through a gap between the body 110 and the substrate support 120. However, according to some embodiments, the grooves 116 are formed in the bottom surface of the body 110 to connect the inside and outside of the body 110, and thus a small leak may not occur.

The grooves 116 may be formed in the bottom surface of the body 110 in a thickness direction of the body 110. In addition, the grooves 116 may be arranged along the edges of the bottom surface of the body 110. Inert gas introduced through the grooves 116 may be directly directed to the gas exhaust channel 115 formed in the wall of the body 110 and may be discharged to the outside. That is, inert gas introduced through the grooves 116 may not permeate the lower space 113a and may flow to the gas exhaust channel 115. Therefore, in the deposition apparatus 100, a small leak occurring between the body 110 and the substrate support 120 may be fundamentally prevented, and even though inert gas flows into the body 110, the inert gas may not permeate the lower space 113a.

The grooves 116 may be arranged along the outer circumference of the body 110 at regular intervals. The grooves 116 may have a width of about 1 mm and a height of about 0.5 mm. However, the grooves 116 are not limited thereto. The size and shape of the grooves 116 and the interval between the grooves 116 may be variously varied according to process conditions.

Referring to FIGS. 5 and 7, in some embodiments, a protruding portion 122 protrudes from the main surface of the substrate support 120 in a direction perpendicular to the main surface. The protruding portion 122 may prevent external gas introduced through the grooves 116 from flowing into the lower space 113a.

The protruding portion 122 may be separated from an edge of the substrate support 120 by a constant distance and may continuously extend along an edge of the main surface of the substrate support 120. For example, the protruding portion 122 may have a ring shape.

While preventing inert gas introduced through the grooves 116 from flowing to the lower space 113a, the protruding portion 122 may guide the inert gas toward the gas exhaust channel 115. In addition, the protruding portion 122 may prevent contaminants such as particles remaining in the contact region from entering the lower space 113a and may induce the contaminants to flow together with introduced inert gas toward the gas exhaust channel 115. Thus, the reaction space may be kept clean during a process. Furthermore, the protruding portion 122 may prevent exhaust gas discharged from the lower space 113a from flowing toward the grooves 116 and may guide the exhaust gas to the gas exhaust channel 115.

In addition, the substrate support 120 may include a recess portion 124 connected to the protruding portion 122 at a side towards the center of the substrate support 120 and extending along the protruding portion 122. For example, the recess portion 124 may have a ring shape. The recess portion 124 may include a first side 124a adjacent to the protruding portion 122, a second side 124b facing the first side 124a, and a bottom side 124c. A region surrounded by the first side 124a, the second side 124b, and the bottom side 124c may be referred to as a recess region. A lower side of the body 110 may partially extend into the recess region of the recess portion 124, and thus gas discharged from the lower space 113a may flow in a winding path along the surface of the recess portion 124.

Figure 8:
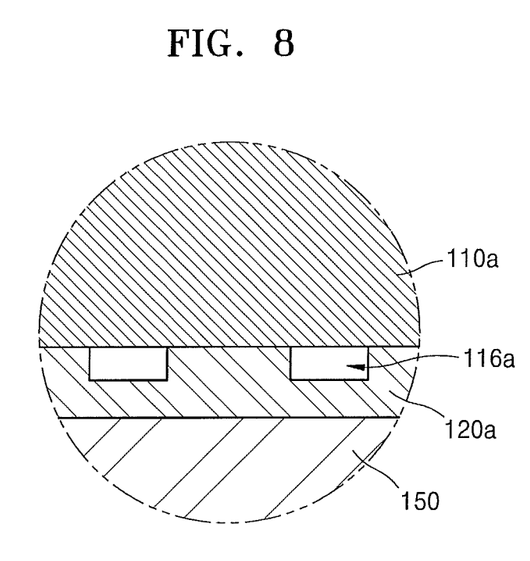
FIG. 8 is an enlarged view taken in the direction A in FIG. 2 to illustrate a contact region between a body and a substrate support according to another embodiment.

FIG. 8 is an enlarged view taken in the direction A in FIG. 2 to illustrate a contact region between a body 110a and a substrate support 120a according to another embodiment. The structure of the deposition apparatus 100 illustrated in FIG. 8 may be similar to the structure illustrated in FIG. 6 except for the positions of grooves 116a. In FIGS. 8 and 6, like reference numerals refer to like elements, and repeated descriptions thereof will be omitted.

Referring to FIGS. 8 and 2, the grooves 116a are not formed in a bottom surface of the body 110a. That is, the grooves 116a are formed in a main surface of the substrate support 120a unlike the embodiment illustrated in FIG. 6.

For example, the grooves 116a may be formed in an edge region of the main surface of the substrate support 120a. The grooves 116a may be arranged at intervals along an edge of the main surface of the substrate support 120a. Upper sides of the grooves 116a may contact the body 110a. Like the grooves 116 formed in the bottom surface of the body 110 (refer to FIG. 6), the grooves 116a may connect an outer region of the body 110a to the gas exhaust channel 115. Although the bottom surface of the body 110 shown in FIG. 6 has a concave-convex shape, the bottom surface of the body 110a may be smooth and placed on a single plane.

Figure 9:
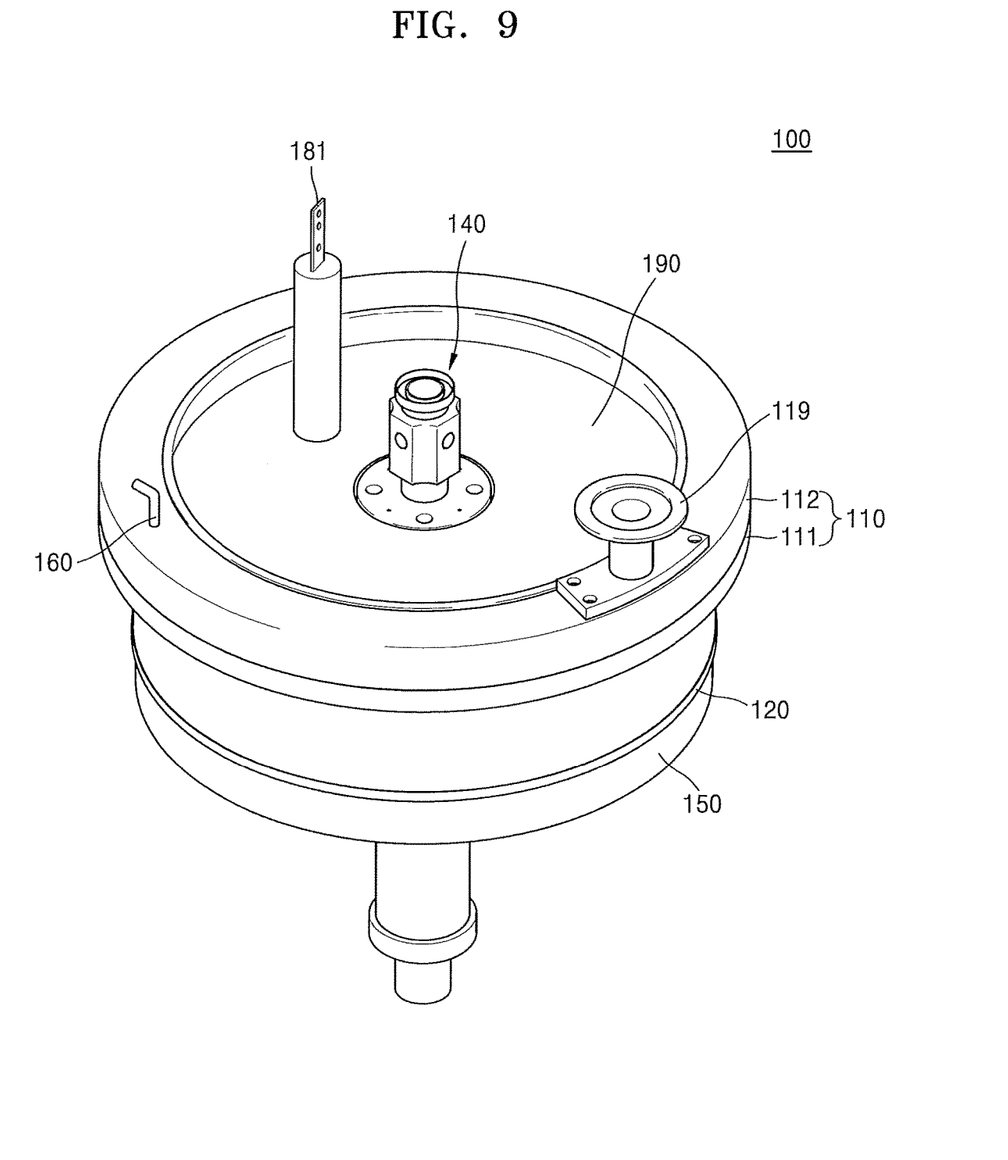
FIG. 9 is a perspective view illustrating a deposition apparatus according to another embodiment.

FIG. 9 is a perspective view illustrating a deposition apparatus 100 according to another embodiment.

The deposition apparatus 100 may include a substrate support 120, a body 110, a plasma electrode unit 130, support members 170, a gas supply unit 140, and a cover unit 190. The substrate support 120, the body 110, the plasma electrode unit 130, the support members 170, and the gas supply unit 140 may have the same structures as those illustrated with reference to FIGS. 1 to 8. However, unlike the deposition apparatus 100 described with reference to FIGS. 1 to 8, the deposition apparatus 100 of the current embodiment may further include the cover unit 190.

The cover unit 190 is placed at the top of the body 110 to cover an opening of the body 110. The cover unit 190 may be provided for the safety of workers during a plasma process. The cover unit 190 may be selectively attached to the body 110 and detached from the body 110. The cover unit 190 may include a metal-containing material. For example, the cover unit 190 may include aluminum (Al). The cover unit 190 may prevent diffusion of plasma.

Figure 10:
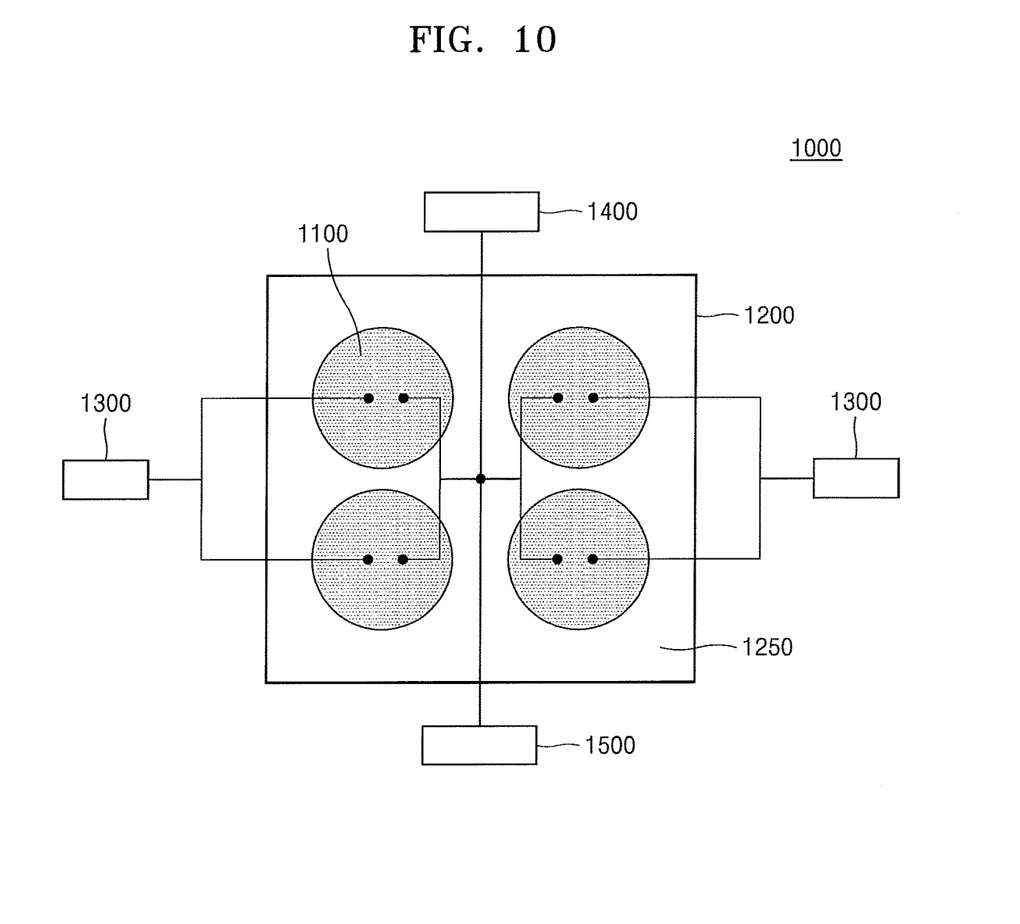
FIG. 10 is a schematic view illustrating a deposition system according to an embodiment.

FIG. 10 is a schematic view illustrating a deposition system 1000 according to an embodiment.

Referring to FIG. 10, the deposition system 1000 may include: an outer chamber 1200 having an internal space 1250; and at least one deposition apparatus 1100 placed in the internal space 1250. The deposition apparatus 1100 may be one of the deposition apparatuses 100 illustrated with reference to FIGS. 1 to 9. The deposition system 1000 may include two or more deposition apparatuses 1100 to improve productivity in mass production. In FIG. 10, four deposition apparatuses 1100 are illustrated. A rotatable, vertically movable substrate transfer arm (not shown) may be provided among the four deposition apparatuses 1100, that is, in a center region of the outer chamber 1200, so as to load substrates on the four deposition apparatuses 1100 and unload the substrates from the four deposition apparatuses 1100.

Referring to FIG. 10, the deposition apparatuses 1100 may receive deposition gas from a deposition gas source 1400 and reaction gas from a reaction gas source 1500. In addition, exhaust gas discharged through exhaust outlets 119 (refer to FIG. 2) of the deposition apparatuses 1100 may be discharged through exhaust lines by using exhaust pumps 1300. In this case, at least one deposition apparatus 1100 may share, with at least another deposition apparatus 1100, the exhaust pumps 1300, the exhaust lines connected between the deposition apparatus 1100 and the exhaust pumps 1300, the deposition gas source 1400, and the reaction gas source 1500. Thus, degrees of freedom may increase when designing the deposition system 1000, and deposition processes may be efficiently managed. However, the sharing method illustrated in FIG. 10 is a non-limiting example according to which the deposition apparatuses 1100 may share the exhaust pumps 1300, the deposition gas source 1400, and the reaction gas source 1500. That is, the deposition system 1000 may use any other sharing method to improve productivity and efficiency.

The internal space 1250 of the outer chamber 1200 may be filled with inert gas, and the pressure of the internal space 1250 may be set to be higher than the inside pressures of the deposition apparatuses 1100. In this case, the inert gas may flow from the internal space 1250 into the deposition apparatuses 1100 through grooves 116 (refer to FIG. 5) formed in bodies 110 (refer to FIG. 5) of the deposition apparatuses 1100 and may be discharged through gas exhaust channels 115 (refer to FIG. 5) formed in reactor walls 111.

As described above, according to the one or more of the above embodiments, the gas exhaust channel is formed in the wall of the body of the deposition apparatus, and thus exhaust gas discharged from the reaction space may be directed upward to the outside of the deposition apparatus. Therefore, the deposition apparatus may be free from contamination of an outer chamber that may occur in a multiple deposition apparatus including a plurality of open reactors having a downward exhaust structure. In addition, since the grooves are formed in the contact region between the body and the substrate support to allow inert gas to flow into the deposition apparatus from the outer chamber, reaction byproducts may not be accumulated on the contact surface between the body and the substrate support, and thus reactors may not be contaminated. In addition, owing to the protruding portion formed on the contact surface, reaction products remaining on the contact surface and inert gas introduced into the deposition apparatus from the external chamber through the grooves may not permeate the reaction space and may be discharged through the gas exhaust channel. Therefore, during a process, the reaction space may not be contaminated, and the process may not be negatively affected by external gas.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

What is claimed is:

1. A deposition apparatus comprising:
a substrate support having a main surface on which a substrate is placed;
a body disposed on the main surface of the substrate support and comprising a hollow portion having an exposed upper portion;
a plasma electrode unit provided at an inner circumferential surface of the body and defining an upper space and a lower space of the hollow portion, the upper space being filled with an external gas; and
a gas supply unit supplying process gas to the plasma electrode unit,
wherein the body defines a gas exhaust channel therein, the gas exhaust channel extending from the lower space to an exhaust outlet provided at a top of the body, and
wherein the body defines at least one groove therein that is formed on the bottom surface of the body, and the at least one groove is configured to connect an outer region of the body and the gas exhaust channel.

2. The deposition apparatus of claim 1, wherein the substrate support comprises a protruding portion that protrudes in a direction perpendicular to the main surface of the substrate support and extends along an edge of the main surface while being spaced apart from the edge of the main surface of the substrate support.

3. The deposition apparatus of claim 2, wherein the substrate support comprises a recess portion connected to the protruding portion at a side towards a center of the substrate support and extending along the protruding portion.

4. The deposition apparatus of claim 1, wherein the body comprises a support stepped portion protruding inward along the inner circumferential surface of the body, and
the deposition apparatus further comprises a support member disposed between the support stepped portion and the plasma electrode unit, the support member supporting the plasma electrode unit such that the plasma electrode unit is spaced apart from the body.

5. The deposition apparatus of claim 4, wherein the gas supply unit comprises a flange portion in a region connected to the plasma electrode unit,
wherein the flange portion and the support member comprise an insulating material.

6. The deposition apparatus of claim 5, wherein the plasma electrode unit comprises a showerhead electrode and a back plate disposed between the showerhead electrode and the flange portion.

7. The deposition apparatus of claim 6, wherein the back plate comprises an insulating material.

8. The deposition apparatus of claim 7, wherein the back plate comprises a gas supply channel connected to a plurality of nozzles formed at the showerhead electrode.

9. The deposition apparatus of claim 8, further comprising a sealing member disposed between the support member and the support stepped portion, between the support member and the showerhead electrode, between the showerhead electrode and the back plate, and between the back plate and the flange portion.

10. The deposition apparatus of claim 6, wherein the showerhead electrode is connected to at least one radio frequency (RF) connector.

11. The deposition apparatus of claim 1, wherein the body comprises a reactor wall and a duct member connected to a top of the reactor wall.

12. The deposition apparatus of claim 11, wherein a first depressed portion is formed at the top of the reactor wall and a second depressed portion corresponding to the first depressed portion is formed at a side of the duct member,
wherein the first and second depressed portions are combined to form an exhaust path forming a part of the gas exhaust channel, and the exhaust path is connected to the exhaust outlet.

13. The deposition apparatus of claim 12, further comprising a sealing member disposed at a surface formed from a combination of the reactor wall and the duct member.

14. The deposition apparatus of claim 13, wherein the gas exhaust channel comprises:
a first channel connected to the lower space and formed along an outer circumference of the body, between the outer circumference and an inner circumference of the body;
a second channel connected to the exhaust outlet and formed along the outer circumference of the body, between the outer and inner circumferences of the body; and
exhaust holes connecting the first and second channels.

15. The deposition apparatus of claim 1, further comprising a cover unit disposed at the top of the body and covering the upper space.

16. The deposition apparatus of claim 1, further comprising a moving unit moving the substrate support in an up-and-down direction.

17. A deposition system comprising:
an outer chamber having an inner space;
at least one deposition apparatus provided in the inner space;
a deposition gas source supplying a deposition gas to the at least one deposition apparatus;
a reaction gas source supplying a reaction gas to the at least one deposition apparatus; and
an exhaust pump connected to the at least one deposition apparatus via an exhaust line,
wherein the at least one deposition apparatus comprises the deposition apparatus of claim 1.

18. The deposition system of claim 17, wherein pressure in the inner space of the outer chamber is higher than pressure in the at least one deposition apparatus.

19. The deposition system of claim 17, wherein the at least one deposition apparatus shares, with at least one other deposition apparatus, the deposition gas source, the reaction gas source, and the exhaust line connecting the at least one deposition apparatus and the exhaust pump.

20. A deposition apparatus comprising:
a substrate support having a main surface on which a substrate is placed;
a body having a bottom surface at least partially contacting an edge portion of the main surface of the substrate support and a top surface at least partially externally exposed; and
a plasma electrode unit provided at an inner circumferential surface of the body, the plasma electrode defining a reaction space below the plasma electrode unit and an upper space above the plasma electrode, the upper space being filled with an external gas;
wherein the body defines a gas exhaust channel therein, the gas exhaust channel extending from the reaction space to an exhaust outlet provided at a top of the body, and
wherein the body defines at least one groove that is formed at any one of the body and the substrate support in a region where the body and the substrate support contact each other, and the at least one groove is configured to connect an outer region of the body and the gas exhaust channel.

21. The deposition apparatus of claim 20, wherein the body comprises a reactor wall and a duct member connected to a top of the reactor wall.

22. The deposition apparatus of claim 21, wherein a first depressed portion is formed at the top of the reactor wall and a second depressed portion corresponding to the first depressed portion is formed at a side of the duct member,
wherein the first and second depressed portions are combined to form an exhaust path forming a part of the gas exhaust channel, and the exhaust path is connected to the exhaust outlet.

23. The deposition apparatus of claim 22, further comprising a sealing member provided at a surface formed from a combination of the reactor wall and the duct member.

24. The deposition apparatus of claim 23, wherein the plasma electrode unit comprises a showerhead electrode connected to at least one radio frequency (RF) connector.

25. A deposition system comprising:
an outer chamber having an inner space;
at least one deposition apparatus in the inner space;
a deposition gas source supplying a deposition gas to the at least one deposition apparatus;
a reaction gas source supplying a reaction gas to the at least one deposition apparatus; and
an exhaust pump connected to the at least one deposition apparatus via an exhaust line,
wherein the at least one deposition apparatus comprises the deposition apparatus of claim 20.

26. The deposition system of claim 25, wherein pressure in the inner space of the outer chamber is higher than pressure in the at least one deposition apparatus.

27. The deposition system of claim 25, wherein the at least one deposition apparatus shares, with at least one other deposition apparatus, the deposition gas source, the reaction gas source, and the exhaust line connecting the at least one deposition apparatus to the exhaust pump.

* * * * *